United States Patent [19]
Schmid

[11] Patent Number: 5,297,568
[45] Date of Patent: Mar. 29, 1994

[54] PROCESS AND APPARATUS FOR TREATMENT OF BOARD-LIKE ARTICLES

[75] Inventor: Dieter C. Schmid, Freudenstadt, Fed. Rep. of Germany

[73] Assignee: Gebr. Schmid GbmH & Co., Freudenstadt, Fed. Rep. of Germany

[21] Appl. No.: 847,708

[22] Filed: Mar. 6, 1992

[30] Foreign Application Priority Data

Mar. 8, 1991 [DE] Fed. Rep. of Germany ....... 4107464

[51] Int. Cl.⁵ .............................................. B08B 3/02
[52] U.S. Cl. ................................. 134/62; 134/64 R; 134/122 R; 134/131; 134/902; 198/404
[58] Field of Search .................. 134/62, 64 R, 122 R, 134/126, 131, 902; 198/379, 405, 404

[56] References Cited

U.S. PATENT DOCUMENTS

| | | |
|---|---|---|
| 3,610,397 | 10/1971 | Bok . |
| 3,773,058 | 11/1973 | Kittermann et al. .................. 134/62 |
| 3,939,533 | 2/1976 | Richard ............................. 134/62 X |
| 4,344,380 | 8/1982 | Matsumiya et al. . |
| 4,798,278 | 1/1989 | Cornacchia .......................... 198/404 |
| 4,922,938 | 5/1990 | Siegmund et al. . |
| 4,949,665 | 8/1990 | Weber . |

FOREIGN PATENT DOCUMENTS

| | | |
|---|---|---|
| 354266 | 2/1990 | European Pat. Off. . |
| 1047713 | 12/1958 | Fed. Rep. of Germany . |
| 1818688 | 9/1960 | Fed. Rep. of Germany . |
| 1432310 | 3/1969 | Fed. Rep. of Germany ........ 134/12 |
| 1953525 | 11/1970 | Fed. Rep. of Germany . |
| 1956050 | 5/1971 | Fed. Rep. of Germany ........ 134/62 |
| 2156543 | 6/1973 | Fed. Rep. of Germany ........ 134/62 |
| 7539432 | 1/1977 | Fed. Rep. of Germany . |
| 3214457 | 10/1983 | Fed. Rep. of Germany . |
| 3602350 | 7/1987 | Fed. Rep. of Germany . |
| 3631270 | 3/1988 | Fed. Rep. of Germany . |
| 3735798 | 5/1989 | Fed. Rep. of Germany . |
| 3935831 | 5/1991 | Fed. Rep. of Germany . |
| 3937071 | 5/1991 | Fed. Rep. of Germany . |
| 610328 | 5/1978 | U.S.S.R. . |

*Primary Examiner*—Frankie L. Stinson
*Attorney, Agent, or Firm*—Barry R. Lipsitz

[57] ABSTRACT

The process and apparatus more particularly relate to the manufacture of printed circuit boards. They are successively treated with a liquid on their top and bottom and intermediately turned over. The boards (23) are horizontally supplied to the turning over station (16) and after turning over are supplied to the station for the treatment of the second side thereof.

21 Claims, 1 Drawing Sheet

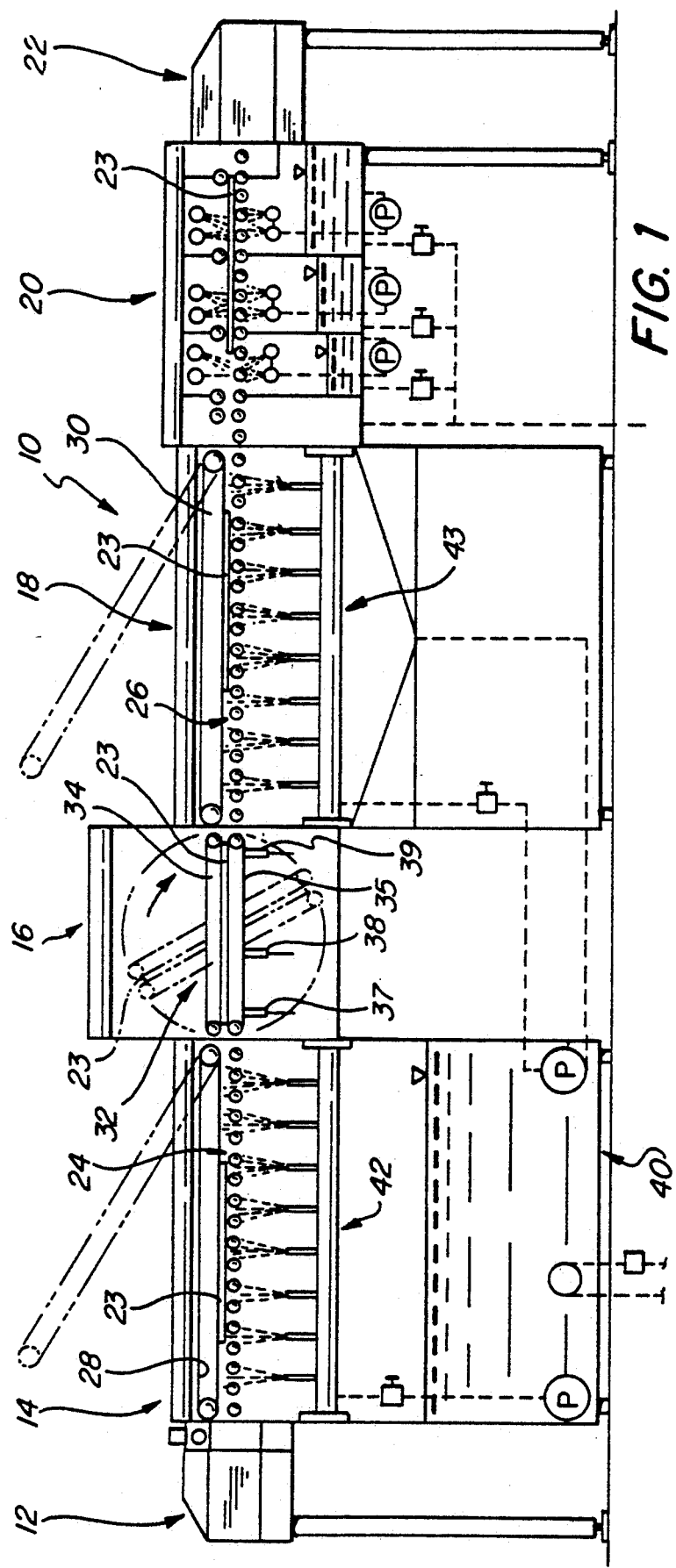
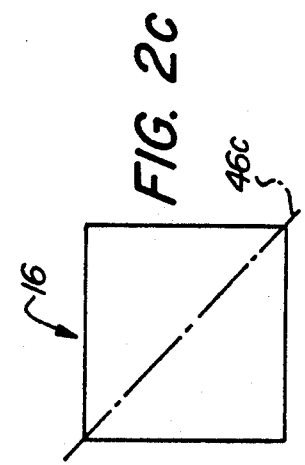
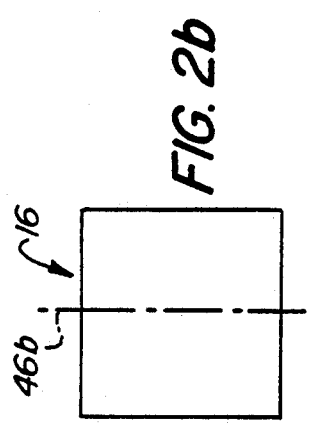
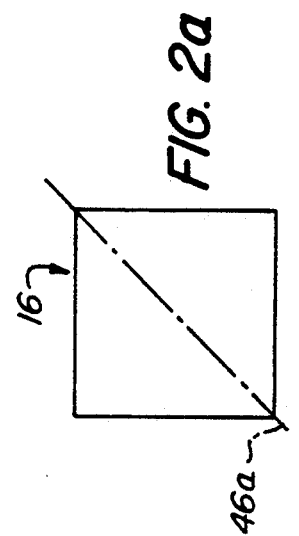

PROCESS AND APPARATUS FOR TREATMENT OF BOARD-LIKE ARTICLES

FIELD OF THE INVENTION

The invention relates to a process and to an apparatus for the one-sided treatment of board-like articles using a liquid medium, the boards being conveyed horizontally through a treatment apparatus, the boards being treated in a first stage and in a first treatment station on the side thereof located at the bottom by the liquid medium, in a second stage the boards are supplied to a turning over mechanism and are turned over therein and in a third stage the boards are treated on their side at the top in the first stage with the liquid medium.

BACKGROUND OF THE INVENTION

In the hitherto known processes printed circuit boards are returned after a one-sided treatment to the intake of the treatment apparatus and are then fed again into the latter in the turned over state.

Such a process does not fit into a production line based on a horizontal, continuous process, because the production line is interrupted as a result of the closed circuit guidance of the boards.

OBJECT OF THE INVENTION

An object of the present invention is to so further develop the above-described apparatus, that it can be incorporated into a continuously operating, horizontal production process.

SUMMARY OF THE INVENTION

According to the invention this problem is solved in that the boards are horizontally supplied from the treatment station to the turning over mechanism and after turning over are immediately supplied by the turning over station to a further treatment station for performing the third stage.

The furthest treatment station can be constituted by a second treatment station directly connected to the first treatment station. However, it is also possible to use the first treatment station as a further treatment station and the boards are then supplied, after turning over, to the first treatment station in the opposite direction to the general conveying direction of the treatment apparatus.

Thus, in this case the boards are not returned to the intake area of the first treatment station and are instead directly returned from the turning over mechanism to the first treatment station.

In order to introduce the system into a continuous process, it is only necessary to ensure in this case that the boards are supplied in such time intervals to the treatment apparatus that a complete treatment can take place, i.e. a treatment of the top and bottom of a board in the first treatment station before the next board is supplied to the treatment apparatus.

A higher throughput of boards per unit of time is obviously obtained if a second treatment station, corresponding to the first treatment station, is linked with the turning over mechanism. In this case the boards can be supplied to the treatment apparatus in small time intervals.

The process in which the first treatment station is also used as the further treatment station offers the possibility of housing the treatment apparatus in a very confined space, so that this solution is adopted in the case of constricted space conditions with a reduced number of boards per unit of time.

Normally the boards are rotated about an axis by means of the turning over mechanism and said axis is positioned parallel to the conveying plane and at right angles to the conveying direction. Considered in the conveying direction of the boards the rotation axis of the turning over mechanism is positioned roughly centrally in the latter.

However, within the framework of more recent developments in circuit board technology, it is more frequently encountered that certain preferred directions exist with respect to the conductor tracks applied to the surfaces, which differ on the top and bottom of the board and form an angle of 90° to one another.

As it is preferable to take account of the direction of travel of the conductor tracks during the application of the liquid medium, in an embodiment of the invention the rotation axis of the turning over mechanism is parallel to the conveying plane, but forms an angle of 45° with the conveying direction.

Thus, simultaneously with the rotation of the boards, in which the underside passes into the top position, the boards are rotated in the conveying plane by 90°. Thus, the boards are supplied with an optimum alignment to the further treatment station, which can now have an identical arrangement of the apparatus for wetting or spraying the underside to the first treatment station. Thus, even in the case where the turned over boards of the first treatment station are supplied in the opposite direction to the general conveying direction, there is an optimum treatment of the board side which was previously at the top.

Preferably the board sides at the top are substantially completely covered in the first and third stages, so that there is no access for the liquid treatment medium. This ensures that the treatment results are uniform and that there is no undesired aftertreatment of the in each case top board side.

In the case of constricted space conditions, on conveying through the treatment apparatus the boards can be stopped or slowed down in the vicinity of the first and further treatment station during the actual treatment stage and after treatment in the first and further treatment station the boards are conveyed on at the original speed.

As the treatment times of the surfaces of the board are generally dependent on reaction speeds, diffusion processes and the like, which determine the advance of the treatment of the particular board side and which cannot be varied without modifying the treatment medium or the construction of the board, in this way and with an otherwise unchanged treatment process a more compact construction of the treatment apparatus can be obtained. The time spent by the boards in the particular treatment station remains substantially the same, but the conveying path or the extension of the treatment station in the conveying direction can be kept much smaller than is conventionally the case. An even more compact solution can be achieved if the first treatment station is also used as the further treatment station and then the boards are once again returned counter to the general conveying direction of the treatment apparatus into the first treatment station for performing the third stage.

The liquid medium is fed against the bottom side of the board, preferably in the form of a liquid surge, which ensures a large-area, intensive wetting of the underside of the board, e.g. a standing wave.

Additionally or alternatively thereto, the liquid medium can be supplied to the bottom side of the board by means of a plurality of spraying and/or atomizing nozzles. The choice of the apparatus for supplying the liquid medium to the bottom side of the board is a function of the particular process to be performed and the degree of wetting required for it or the requisite intensity of the liquid exchange.

Whereas in the case of a normal continuous process the means which supply the liquid medium to the bottom side of the board can be substantially fixed, if the conveying speed is reduced in the treatment station or if the boards are stopped, the feed means can be so moved with respect to the board or the surrounding treatment station, that a uniform treatment of the underside of the board takes place over its entire surface area. Preferably the position of the boards on the conveying path through the treatment apparatus is determined by means of sensors. In particular in the vicinity of the turning over mechanism a sensor should be provided which detects the entry of the rear board edge into the turning over mechanism. This signal can also be utilized for stopping the conveying means of the turning over mechanism at the instant in which the board has completely entered the turning over mechanism. During a following pivoting of the board, the previously rear board edge is positioned as the front edge directly adjacent to the following treatment station, so that the turning over of the board is simultaneously associated with a conveying thereof towards the further or second treatment station. Therefore the time required for the process between the two treatment stations or the two treatment stages can be minimized.

Hitherto known apparatuses for performing a process of the aforementioned type comprise a conveying apparatus for the horizontal conveying of the boards through the apparatus, a treatment station for treating the bottom side of the boards with a liquid medium and a turning over mechanism for rotating the boards so that their bottom side passes into the top position.

Another problem of the invention is to so further develop this treatment apparatus, that it is suitable for the inventive treatment process.

This problem is inventively solved in that the turning over mechanism comprises conveying means for the boards which can be driven independently of the conveying apparatus and that the conveying planes formed by the conveying apparatus and the conveying means directly and constantly pass into one another. These additional features of the treatment apparatus ensure that the boards can be horizontally transferred to the turning over mechanism and that, even after turning over, the boards can be immediately supplied to a treatment station.

Preferably the conveying apparatus and the conveying means form a common conveying plane.

Preferably the conveying means of the turning over mechanism are constructed in such a way that the boards are fixed by the conveying means during the rotary process. This obviates the need for an additional retaining device for retaining the boards during rotation in the turning over mechanism.

A rotation axis for the rotary movement of the board can be located in the conveying plane of the conveying means and at right angles to the conveying direction. In this case the underside of the board is rotated into the top position and the previously rear edge becomes the leading edge of the board in the conveying direction.

Alternatively or additionally a rotation axis for the rotary movement of the boards is provided, which is located in the conveying plane of the conveying means and at an angle of 45° to the conveying direction.

If a rotation is performed about this axis, then in addition to the rotation of the bottom of the board into the top position, the board is rotated by 90°, so that what was previously a lateral edge now functions as the leading board edge.

In a preferred embodiment of the invention a device is provided for determining a preferred direction on one of the surfaces of the boards and then the rotation axis for the rotary movement of the boards is selected as a function of the determined preferred direction.

The device for determining the preferred direction can be a device for scanning machine-readable information on the top of the board or can be an interface to the equipment control by means of which the information regarding the preferred direction of the particular board side can be transmitted.

The preferred direction of a surface of the board is dependent on how the conductor tracks thereof are mainly aligned, because this very significantly influences the treatment result when treating the boards. This is more particularly the case if the conductor tracks have very small dimensions, as is ever more frequently the case due to the increasing integration density of the electronic components to be placed on the circuit boards.

Preferably the turning over mechanism has a sensor for detecting the rear edge of the board entering said mechanism, so that immediately after the board has completely entered the turning over mechanism, its conveying means can be stopped, so that following a rotation of the turning over mechanism the rear edge, which now appears as the leading edge of the board, is located in the immediate vicinity of the following treatment station.

Preferably the conveying apparatus above the conveying means comprises a revolving endless belt, the underside of the belt covering the top of the boards. To ensure that the top of the boards do not come into contact with the liquid medium during the treatment of the bottom, the belt is preferably designed in such a way that it substantially completely and in liquid-tight manner covers the top of the boards.

A particularly simple solution for holding the boards within the turning over mechanism is provided in that the conveying means of the latter comprise an endless, revolving belt both above and below the conveying plane. Within the turning over mechanism the boards are then contacted by the underside or overside of the two endless revolving boards and are kept fixed. It is sufficient to stop the conveying means of the turning over mechanism in order to fix the board in a specific position within the mechanism for a rotary process.

The endless belt of the treatment station and also the endless belts of the conveying means of the turning over mechanism substantially have a width corresponding to the entire working width of the apparatus.

For the easier maintenance of the treatment apparatus, those parts of the conveying apparatus positioned above the conveying plane can be pivotably held as an entity on the apparatus.

One of the preferred pivoting axes for the upper part of the conveying apparatus is parallel to the conveying plane and at right angles to the conveying direction.

An alternative would be the arrangement of the pivoting axis parallel to the conveying direction and parallel to the conveying plane and then the pivoting axis should be positioned outside the normal working area of the treatment stations.

In the case where several treatment stations are operated with the same liquid medium, preferably at least two of the treatment stations are supplied with said liquid medium from a common tool.

The actual treatment station can comprise a nozzle assembly or body with a plurality of nozzles, which is designed for the spraying or atomizing treatment of the bottom of the board. When arranging the nozzles on the assembly it is ensured that a uniform spray pattern is obtained, so that the treatment result on the bottom of the board is at all points comparable with that in the neighbouring areas.

An even more uniform treatment of the bottom of the board with the liquid medium is achieved if the nozzle assembly is constructed so as to be movable with respect to the boards located in the treatment station. This nozzle assembly movement possibility can make it sufficient to fix the board in the treatment station and to only move the nozzle assembly relative to the board or to move the board at a very slow advance speed through the treatment station without impairing the quality of the treatment result.

In place of or in addition to the nozzle assembly it is also possible to have a surge section, which is either fixed or, in the case that the boards are to be treated in a substantially stationary manner, is movable over the board treatment position.

In a preferred configuration of the treatment apparatus, the first treatment station is immediately followed by the turning over mechanism and then, considered in the conveying direction, the further, second treatment station, together with a cleaning or rinsing module.

In the case where the treatment apparatus has to be set up under constricted space conditions, following the first treatment station is provided the turning over mechanism and then, in the conveying direction, this is immediately followed by a cleaning or rinsing module. The first treatment station is used as the further treatment station and, after turning over the turning over mechanism returns the boards, counter to the general conveying direction of the treatment apparatus, to the first treatment station.

BRIEF FIGURE DESCRIPTION

These and further advantages of the invention are described in greater detail hereinafter relative to the drawings, wherein show:

FIG. 1 A partly broken away side view of an inventive treatment apparatus.

FIGS. 2a, b & c Alternatives for the rotation axis for an inventive turning over mechanism.

DETAILED DESCRIPTION OF A PREFERRED EMBODIMENT

The treatment apparatus 10 in FIG. 1 has a modular construction and comprises a washing or rinsing module 20, together with an outlet 22, in addition to an intake station 12, a first treatment station 14, a turning over mechanism 16 and a second treatment-station 18. Within the overall apparatus 10 a conveying plane is defined by the driving roll or sprocket systems 24,26, which lead from the intake 12 through the first treatment station 14, interrupted by the turning over mechanism 14, via the second treatment station 18 and the rinsing module 20 to the outlet 22.

Above the conveying plane formed by the sprocket systems 24,26 revolving endless belts 28,30 are provided in the vicinity of the first and second treatment stations 14,18 and can be pivoted upwards parallel to the board conveying direction. The pivoting axis is parallel to the conveying plane and at right angles to the conveying direction and with the pivoting of the belt systems substantially the entire area of the sprocket systems 24,26 become freely accessible for maintenance purposes.

In the case of the apparatus according to the invention, the function of the endless belts is to cover the top side of the printed circuit boards 23, so that this side can no longer be wetted by the liquid treatment medium supplied from below and in particular the etching agents used in etching processes. This makes it possible to reliably avoid an undesired post-etching or pre-etching of the top board sides.

The gap between the sprocket systems 24 and 26 is bridged by the conveying means 32 of the turning over mechanism 16 which, in their starting position, interconnect in coplanar manner the conveying plane of the sprocket systems 24,26.

The conveying means 32 of the turning over mechanism 16 substantially comprises two endless belts 34,35, drivable in oppositely directed manner and which secure the circuit boards 23 between the top side and bottom side if they have passed into the vicinity of the turning over mechanism 16. Sensors 37,38,39 monitor the relative position of the boards within the turning over mechanism 16.

The rinsing module 20 is connected to the second treatment station 18. The still adhering treatment medium is here removed from the boards and as no critical process occurs here, both surfaces are rinsed or wetted using a cleaning liquid, preferably water.

As can be gathered from FIG. 1, the first and second treatment stations use a common collecting vessel 40, which contains a supply of the treatment liquid for both application systems. Nozzle systems 42,43 comprising a plurality of uniformly distributed spraying nozzles held in a frame, spray the treatment liquid against the bottom of the boards. The nozzle system frames are preferably removable, so that it is easily possible to maintain the spraying nozzles when the nozzle assembly is withdrawn from the treatment station.

FIG. 2 shows the three preferred variants of the alignment of the rotation axis 46a, b, c of the turning over mechanism 16. The turning over mechanism is only diagrammatically shown in FIGS. 2a, b, c.

During the operation of the overall apparatus, the printed circuit board 23 enters the first treatment station 14 via the intake and is conveyed on by means of the sprocket system 24 towards the turning over mechanism 16. In the treatment station 14 the bottom side of the board 23 is sprayed with the liquid treatment medium and can be e.g. an etching process, a swelling of a photoresist etc. The conveying path within the treatment station 14 is such that together with the selected conveying speed an adequately long residence time in the treatment station for the particular treatment stage is ensured.

When the board enters the turning over station 16 the sensor 37 detects the entry of the rear edge of the board 23 in the turning over mechanism and supplies a signal to the overall apparatus control system. The latter at this instant stops the conveying means 32 of the turning over mechanism 16, i.e. the two endless belts 34,35 and the rotation process of the turning over mechanism 16 is initiated.

If the circuit board 23 has different preferred directions of the conductor tracks at the initially bottom side and the initially top side, the board 23 is rotated in the turning over mechanism 16 preferably about a rotation axis such as the rotation axes 46a and 46b (cf. FIGS. 2a and c) and not about a rotation axis 46b, as indicated in FIG. 2b. Thus, during the rotation of the board and with the interchanging of the top and bottom sides, there is a simultaneous rotation by 90° "in the board plane", so that the preferred direction of the conductor tracks in the following treatment stage is adapted in an optimum manner to the spray pattern of the treatment station 18.

Due to the fact that the board is stopped immediately after the entry of the rear edge into the turning over mechanism 16, the now leading edge of the board is in the immediate vicinity of the treatment station 18, i.e. through the rotation process in the turning over mechanism 16 there is simultaneously a conveying of the board towards the second treatment station. Therefore the conveying means 32 of the turning over mechanism 16 is stopped during the rotary movement.

Following the performance of the rotary movement by the turning over mechanism 16 the circuit board is directly transferred to the second treatment station 18, where the now top side is treated by the liquid media sprayed from below.

In the following station 20 treatment medium residues are removed from the boards and the latter are if necessary also dried and leave the overall apparatus via the outlet 22.

I claim

1. An apparatus for treating circuit boards with a liquid medium, comprising:
   conveying apparatus for conveying the circuit boards through the apparatus in a conveying direction on a horizontal conveying path;
   at least one treatment station containing application means situated below the conveying path for treating only one side of the circuit boards at a time with the liquid medium, said side being treated facing downwardly; and
   a turning-over mechanism for rotating the circuit boards so that a first side already treated with the liquid medium passes into an upwardly facing position, the turning-over mechanism comprising conveying means for the circuit boards;
   wherein the conveying means convey the circuit boards on said conveying path directly into one of said at least one treatment stations for treatment of a second side of said circuit boards opposite said first side.

2. An apparatus according to claim 1, wherein the conveying apparatus and the conveying means form a common conveying plane.

3. An apparatus according to claim 1, wherein the conveying means are so constructed that the circuit boards are fixed during rotation.

4. An apparatus according to claim 1, wherein a rotation axis for rotary movement of the circuit boards is provided in a conveying plane of the conveying means and at right angles to the conveying direction.

5. An apparatus according to claim 1, wherein a rotation axis for rotary movement of the circuit boards is located in a conveying plane of the conveying means and at an angle of 45° to the conveying direction.

6. An apparatus according to claim 1, wherein the turning over mechanism has a sensor for detecting the rear edge of the circuit board entering the turning over mechanism.

7. An apparatus according to claim 1, wherein the conveying means of the turning over mechanism have a continuously revolving belt above and below the conveying plane.

8. An apparatus according to claim 1, wherein the parts of the conveying apparatus located above the conveying plane are held on the apparatus so as to be pivotable as an entity about a pivoting axis.

9. An apparatus according to claim 8, wherein the pivoting axis is at right angles to the conveying apparatus and parallel to the conveying plane.

10. An apparatus according to claim 1, wherein the application means can be supplied with the liquid medium from a common pool.

11. An apparatus according to claim 1, wherein the application means comprise a nozzle assembly with a plurality of nozzles.

12. An apparatus according to claim 11, wherein the nozzle assembly is movable with respect to the articles located in the treatment station.

13. An apparatus according to claim 1, wherein the first treatment station is followed by the turning over mechanism, said apparatus further comprising:
   a further treatment station following said turning over mechanism in the conveying direction; and
   means for cleaning and/or rinsing said circuit boards following said further treatment means.

14. An apparatus according to claim 1, wherein the first treatment station is immediately followed by the turning over mechanism and then, in the conveying direction, means are provided for cleaning and/or rinsing said circuit boards.

15. An apparatus according to claim 1; wherein the conveying means are drivable independently of the conveying apparatus.

16. An apparatus according to claim 1, wherein the conveying path and the conveying means directly and continuously pass into one another.

17. An apparatus according to claim 1, wherein the turning-over mechanism has a central rotation axis.

18. An apparatus for treating board-like articles with a liquid medium, comprising:
   conveying apparatus for horizontally conveying the articles in a conveying direction;
   at least one treatment station for treating a first side of the articles with a liquid medium when said first side is facing downwardly; and
   a turning over mechanism for rotating the articles so that their first side passes into an upwardly facing top position, the turning over mechanism comprising conveying means for the articles drivable independently of the conveying apparatus; wherein:
   conveying planes formed by the conveying apparatus and the conveying means directly and continuously pass into one another,
   a rotation axis for rotary movement of the articles is provided in the conveying plane of the conveying means,
   means are provided for determining a preferred direction on the surface of the articles, and said rotation axis for rotary movement of the articles is selectable as a function of the determined preferred direction.

19. An apparatus according to claim 18, wherein said rotation axis is selectably provided at one of a right angle to the conveying direction and an angle of 45° to the conveying direction.

20. An apparatus according to claim 19, wherein the at least one endless belt substantially spans the entire working width of the apparatus.

21. An apparatus for treating board-like articles with a liquid medium, comprising:

conveying apparatus for horizontally conveying the articles in a conveying direction;

at least one treatment station for treating a first side of the articles with a liquid medium when said first side is facing downwardly; and a turning over mechanism for rotating the articles so that their first side passes into an upwardly facing top position, the turning over mechanism comprising conveying means for the articles drivable independently of the conveying apparatus; wherein:

conveying planes formed by the conveying apparatus and the conveying means directly and continuously pass into one another;

the conveying apparatus incorporates at least one revolving endless belt above the conveying plane; and the underside of said at least one revolving endless belt covers the top of the articles in a substantially complete and liquid-tight manner.

* * * * *